(12) United States Patent
Krishnan et al.

(10) Patent No.: US 11,876,490 B2
(45) Date of Patent: Jan. 16, 2024

(54) COMPENSATION OF THERMALLY INDUCED VOLTAGE ERRORS

(71) Applicant: Texas Instruments Incorporated, Dallas, TX (US)

(72) Inventors: Sandeep Shylaja Krishnan, Bangalore (IN); Akshay Yashwant Jadhav, Pune (IN); Tallam Vishwanath, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/587,105

(22) Filed: Jan. 28, 2022

(65) Prior Publication Data

US 2022/0329211 A1 Oct. 13, 2022

(30) Foreign Application Priority Data

Apr. 12, 2021 (IN) .............................. 202141016997

(51) Int. Cl.
*H03F 1/30* (2006.01)
*G05F 3/26* (2006.01)

(52) U.S. Cl.
CPC .............. *H03F 1/303* (2013.01); *G05F 3/267* (2013.01); *H03F 2200/375* (2013.01); *H03F 2200/447* (2013.01); *H03F 2200/468* (2013.01)

(58) Field of Classification Search
CPC ............... H03F 1/303; H03F 2200/375; H03F 2200/447; H03F 2200/468; H03F 1/30; H03F 3/343; G05F 3/267
USPC ..................................................... 330/9, 289
See application file for complete search history.

(56) References Cited

U.S. PATENT DOCUMENTS

| 4,749,889 | A | 6/1988 | Legoni et al. |
| 7,420,359 | B1 | 9/2008 | Anderson et al. |
| 8,941,440 | B2 | 1/2015 | Tanaka et al. |
| 10,056,874 | B1 | 8/2018 | Ranta et al. |
| 10,305,433 | B2 | 5/2019 | Ranta et al. |
| 10,361,695 | B2 | 7/2019 | Chauhan et al. |
| 10,439,563 | B2 | 10/2019 | Takagi et al. |

(Continued)

OTHER PUBLICATIONS

International Search Report for PCT/US2022/024238 dated Jul. 8, 2022; 4 pages.

*Primary Examiner* — Hieu P Nguyen
(74) *Attorney, Agent, or Firm* — Ray A. King; Frank D. Cimino

(57) ABSTRACT

Described embodiments include an integrated circuit for temperature gradient compensation of a bandgap voltage. A bandgap core circuit has a bandgap feedback input, a bandgap adjustment input and a bandgap reference output. A resistor is coupled between the bandgap adjustment input and a ground terminal. An offset and slope correction circuit has an offset correction output that is coupled to the bandgap adjustment input. A signal at the offset correction output is trimmed at an ambient temperature. A thermal error cancellation (TEC) circuit has a TEC output coupled to the bandgap adjustment input. The TEC circuit includes first and second temperature sensors that are located apart from each other. A signal at the TEC output is responsive to temperatures at the first and second temperature sensors. An amplifier has an amplifier input and an amplifier output. The amplifier input is coupled to the bandgap reference output.

14 Claims, 4 Drawing Sheets

(56) References Cited

U.S. PATENT DOCUMENTS

| | | |
|---|---|---|
| 11,088,699 B1 * | 8/2021 | Vishwanath ............ H03M 1/06 |
| 2002/0074499 A1 | 6/2002 | Butler |
| 2003/0137355 A1 | 7/2003 | Lin |
| 2020/0136369 A1 | 4/2020 | Chauhan et al. |

* cited by examiner

COMPENSATION OF THERMALLY INDUCED VOLTAGE ERRORS

CROSS-REFERENCE TO RELATED APPLICATION

This application claims priority to India Patent Application No. 202141016997 filed Apr. 12, 2021, which is incorporated herein by reference.

BACKGROUND

This description relates to thermal gradients within voltage reference and voltage regulator circuits. Different regions within an integrated circuit may be at different temperatures due to internal thermal heating. The temperature differences are caused by different amounts of power dissipation in components from different regions of the integrated circuit. The temperature differences within the integrated circuit produce thermal gradients that result in errors in the output voltage or reference voltage.

Line regulation and load regulation are important specifications for voltage references and voltage regulators to meet. However, line regulation and load regulation can be adversely impacted by thermal gradients that may be created as the output buffer amplifier dissipates heat. Voltage regulators and voltage references are intended to provide a constant output voltage regardless of the supply voltage or load current, but errors may occur in the output voltage. These errors in the output voltage can be due, at least in part, to thermal gradients.

The magnitude of the voltage error increases as the thermal gradient on the integrated circuit increases. It is desirable to sense the errors due to thermal gradients on an integrated circuit and to minimize those errors. Preferably, the solution will have low electrical noise, occupy minimal area, and consume minimal quiescent current.

SUMMARY

In a first example, an integrated circuit for temperature gradient compensation of a bandgap voltage includes a bandgap core circuit. The bandgap core circuit has a bandgap feedback input, a bandgap adjustment input and a bandgap reference output. A resistor is coupled between the bandgap adjustment input and ground. An offset and slope correction circuit has an offset correction output that is coupled to the bandgap adjustment input. A signal at the offset correction output is trimmed at an ambient temperature.

A thermal error cancellation (TEC) circuit has a TEC output coupled to the bandgap adjustment input. The TEC circuit includes first and second temperature sensors that are located distant from each other. A signal at the TEC output is responsive to temperatures at the first and second temperature sensors. An amplifier has an amplifier input and an amplifier output. The amplifier input is coupled to the bandgap reference output.

In a second example, an integrated circuit for temperature gradient compensation of a bandgap voltage includes a bandgap reference circuit that has a bandgap adjustment input and a bandgap reference output. A first transistor is at a first location. The first transistor has first and second transistor current terminals and a first control terminal. The second transistor current terminal is coupled to ground through a first resistor. A second transistor is located at a second location. The second transistor has third and fourth transistor current terminals and a second control terminal. The second control terminal is coupled to the first control terminal, and the fourth transistor current terminal is coupled to ground through a second resistor.

A third transistor is located at the second location. The third transistor has fifth and sixth transistor current terminals and a third control terminal. The sixth transistor current terminal is coupled to ground through a resistor. A fourth transistor is located at the first location. The fourth transistor has seventh and eighth transistor current terminals and a fourth control terminal. The fourth control terminal is coupled to the third control terminal, and the fourth transistor current terminal is coupled to ground through a resistor.

A fifth transistor is coupled between the bandgap reference output and the first control terminal, and has a fifth control terminal coupled to the first transistor current terminal. A sixth transistor has ninth and tenth transistor current terminals and a sixth control terminal. The sixth control terminal is coupled to the fifth control terminal, and the tenth transistor current terminal is coupled to the third transistor current terminal. A seventh transistor is coupled between the bandgap reference output and the third control terminal. The seventh transistor has a seventh control terminal coupled to the fifth transistor current terminal.

An eighth transistor has eleventh and twelfth transistor current terminals and an eighth control terminal. The eighth control terminal is coupled to the seventh control terminal, and the twelfth transistor current terminal is coupled to the seventh transistor current terminal. An amplifier has an amplifier input and an amplifier output. The amplifier input is coupled to the eleventh transistor current terminal, and the amplifier output is configured to provide a signal proportional to the temperature difference between the first location and the second location.

In a third example, a temperature sensor circuit includes a first transistor at a first location. The first transistor has first and second transistor current terminals and a first control terminal. The first transistor current terminal is coupled to the first control terminal, and the second transistor current terminal is coupled to ground through a first resistor. The first transistor current terminal provides a first temperature signal responsive to a temperature at the first location.

A second transistor is located at a second location. The second transistor has third and fourth transistor current terminals and a second control terminal. The second control terminal is coupled to the first control terminal, and the fourth transistor current terminal is coupled to ground through a second resistor. A third transistor is located at the second location. The third transistor has fifth and sixth transistor current terminals and a third control terminal. The third control terminal is coupled to the fifth transistor current terminal, and the sixth transistor current terminal is coupled to ground through a third resistor. The fifth transistor current terminal provides a second temperature signal responsive to a temperature at the second location.

A fourth transistor is located at the first location. The fourth transistor has seventh and eighth transistor current terminals and a fourth control terminal. The fourth control terminal is coupled to the third control terminal, and the fourth transistor current terminal is coupled to ground through a fourth resistor.

DETAILED DESCRIPTION

In this description, the same reference numbers depict the same or similar (by function and/or structure) features. The drawings are not necessarily drawn to scale.

Within an integrated circuit, different areas may be at different temperatures as a result of uneven distribution of heat from a single source, such as a power amplifier or a buffer amplifier, that dissipates a relatively higher amount of power. Heat resulting from the power dissipation will be highest close to the amplifier and will decrease proportionally farther from the amplifier. This creates a thermal gradient on the integrated circuit. These thermal gradients result in output voltage errors.

Figure 1:
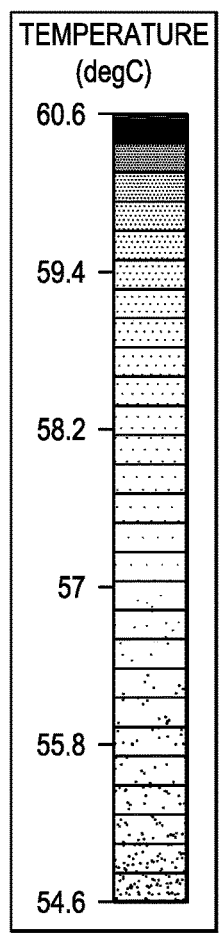
FIG. 1 shows a thermal gradient plot of an example voltage reference integrated circuit.
Figure 1:
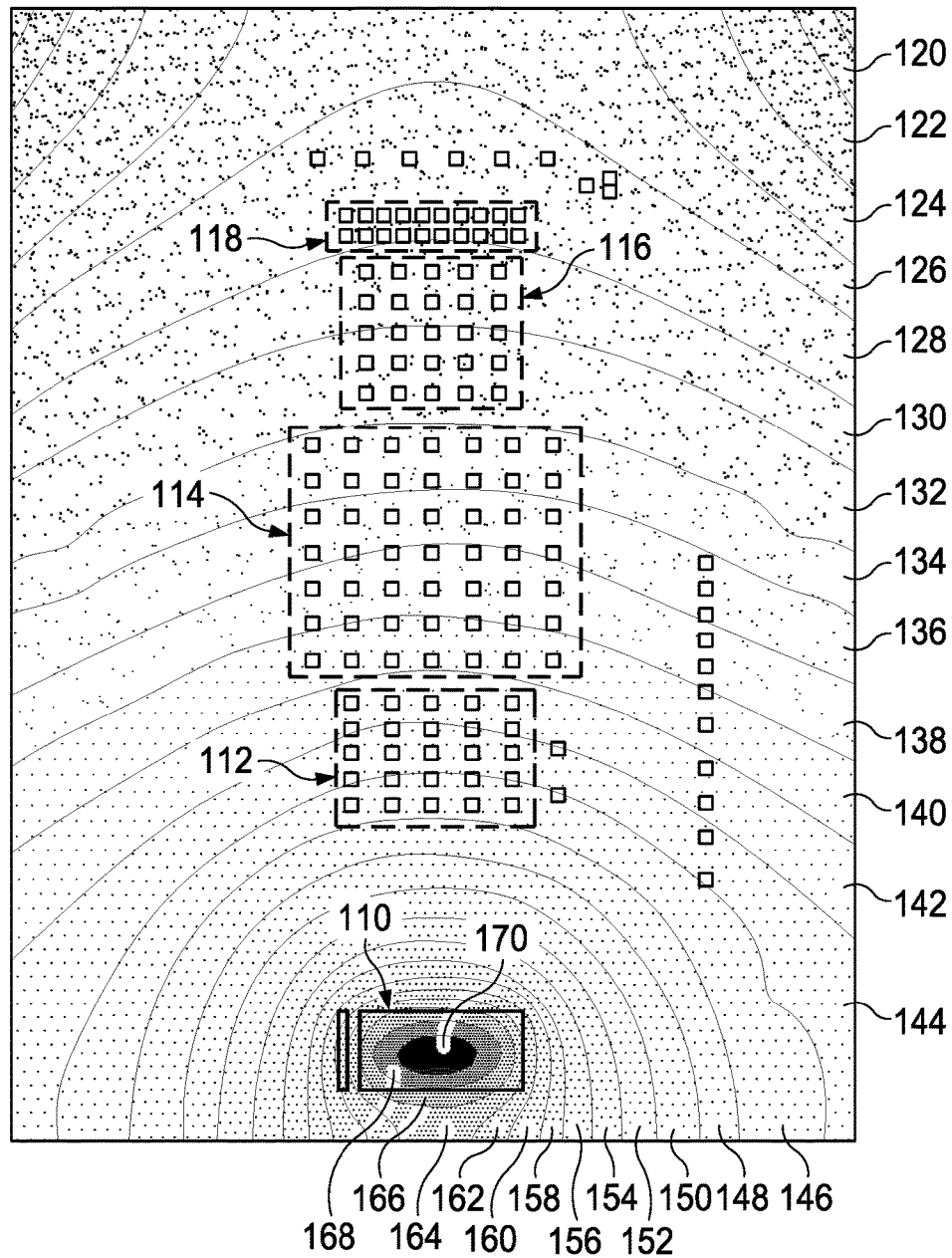

FIG. 1 shows a thermal gradient plot of an example voltage reference integrated circuit 100. Buffer amplifier 110 is located proximate to one end of the integrated circuit 100. A first band gap core circuit 112 is located adjacent to buffer amplifier 110 opposite the one end. A second band gap core circuit 114 is located adjacent to the first band gap core circuit 112, on the side farther away from buffer amplifier 110. Transistor array 116 is located adjacent to the second band gap core circuit 114, on the side farther away from buffer amplifier 110. A trim circuit 118, which can include circuitry for performing a two-temperature trim, is located adjacent to transistor array 116, on the side farther from buffer amplifier 110.

The thermal gradient plot has isotemp regions 120-170 wherein each successively higher numbered isotemp region represents a higher temperature. For example, region 122 represents a higher temperature than region 120, and region 130 represents a higher temperature than region 120 or region 122. Isotemp region 170 represents the highest temperature on integrated circuit 100.

Isotemp region 170, representing the highest temperature, is centered at buffer amplifier 110 because buffer amplifier 110 has the highest power consumption on integrated circuit 100, and is thus the hottest location on integrated circuit 100. The areas that are progressively closer to buffer amplifier 110 are progressively warmer, and areas progressively farther away from the buffer will be proportionately cooler. If bandgap core circuitry (i.e. 112, 114) covers a relatively large area of the integrated circuit, some of the components in the circuit will heat to a higher temperature than components in other sections of the circuit, creating thermal gradients within the circuit.

Two factors that can influence the severity of the temperature gradient are how spatially large the bandgap circuit is, and how much power is dissipated in the buffer amplifier. The temperature gradient varies as $1/r^2$, where r is the distance from the buffer. The temperature gradient increases linearly with respect to buffer amplifier power dissipation. So, there are both first order effects and second order effects contributing to the errors due to a temperature gradient.

One possible solution for minimizing errors due to a temperature gradient is to make the thermal gradient as uniform as possible throughout the integrated circuit. For example, instead of placing the buffer amplifier proximate to one edge, place the buffer amplifier proximate to both edges by splitting the amplifier circuit. If the buffer amplifier is on both edges, the temperature gradient may be more uniform. However, there is a theoretical limit to the obtainable uniformity of the temperature gradient because unless the whole source of the heating is residing throughout the whole integrated circuit, the temperature will always be higher closer to the buffer amplifier, and the temperature will always be lower farther from the buffer amplifier. Therefore, eliminating voltage errors due to temperature gradient by integrated circuit layout alone is not practical. The voltage errors can only be reduced to a certain level using integrated circuit layout. Additionally, this approach brings a significant and undesirable increase in area.

A second possible solution for minimizing errors due to a temperature gradient is to electrically cancel the errors created by the thermal gradient. The voltage error is created by the buffer amplifier driving a current, the current dissipates power, and the power is converted to heat. The heat propagates through the integrated circuit, dissipating proportional to the square of the distance as it gets further from the buffer amplifier, producing a temperature gradient across the integrated circuit. The temperature gradient creates a voltage error signal. By sensing the current in the buffer, a measure of the expected heat in the circuit can be derived. A second current can be generated that is proportional to the first current and having the opposite sign to compensate for the error current.

The compensation signal can be generated from a current in the buffer amplifier, then applied to the bandgap core in the opposite direction. However, sensing only the current in the buffer amplifier is not completely adequate because the heating is due to power dissipation, not just the current. To fully compensate for the error, both the current and the voltage need to be sensed and converted to a power, and that power used to make an estimate of the circuit heating. This requires a multiplier circuit because power is proportional to the product of the voltage and the current. A circuit that processes the voltage and current and performs this multiplication may add too much additional noise to allow meeting important specifications for high-precision low-noise applications. So, an alternative solution is desired.

Thermal-electric cancellation measures and then replicates the source of the error to more closely track the error mechanism and provide a compensation signal for minimizing the error. With thermal-electric cancellation, the temperature at selected points on the integrated circuit is sensed and converted to a compensation signal, rather than separately sensing and processing the input voltage and the load current and converting their product to a power, then estimating the temperature increase based on that power. Thermal-electric cancellation generates the electrical cancellation signal responsive to the thermal mechanism that is generating the error source, and thereby inherently matches the error source more closely.

The error source is not caused by a uniform ambient temperature increase on the integrated circuit. If the voltage error was due to a uniform temperature increase throughout the integrated circuit, the thermal error can be cancelled using a two-temperature trim method to compensate for the temperature drift. However, the error source is a temperature gradient, so a two-temperature trim method will not adequately compensate for the second order effects caused by the temperature gradient throughout the integrated circuit.

Figure 2:
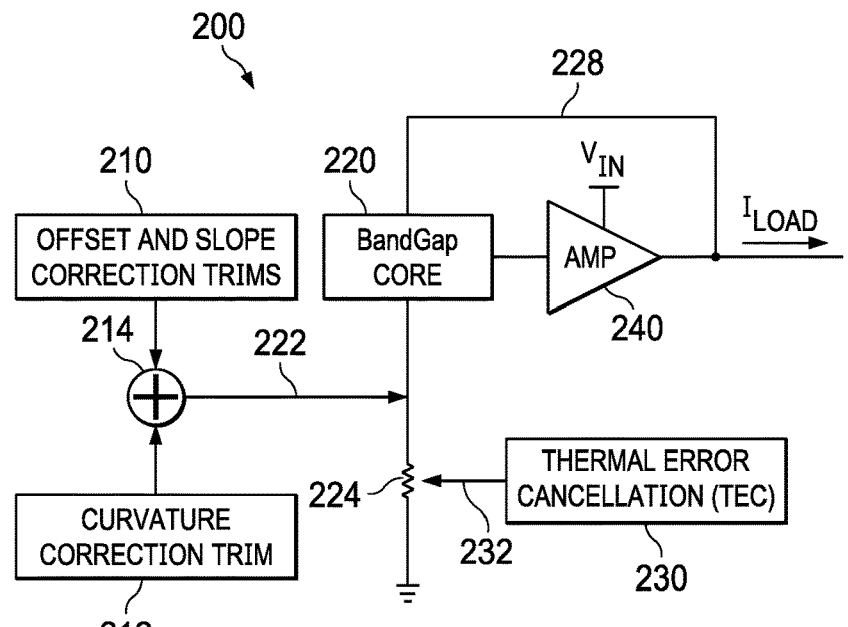
FIG. 2 shows a block diagram for an example thermal electric cancellation circuit.

FIG. 2 shows a block diagram for an example thermal electric cancellation circuit. Bandgap core circuit 220 provides a bandgap reference voltage at its output. The bandgap voltage is set by the voltage across resistor 224, which is determined and adjusted by the current flowing through resistor 224. The output of the bandgap core circuit 220 is coupled to the input of buffer amplifier 240. The output of buffer amplifier 240 is coupled to a feedback input of band gap core circuit 220 and is provided to other circuits as a reference voltage. A bandgap reference voltage is preferably very stable and accurate. However, without compensation, the bandgap reference voltage will provide an inaccurate reference voltage that varies with temperature.

A first compensation signal is provided at the output of the offset and slope correction trim circuit 210. In many cases, the output of the offset and slope correction trim circuit 210 is adjusted at ambient room temperature. A second compensation signal is provided at the output of the curvature correction trim circuit 212 to reduce the error in the bandgap voltage due to global temperature differences in ambient conditions. Adjustments to the output of the curvature correction trim circuit 212 can be performed using a two-temperature test, wherein measurements are made at two known ambient temperatures, and a temperature drift coefficient is determined.

The outputs of the slope correction trim circuit 210 and the curvature correction trim circuit 212 are currents that are added together at summing block 214 and provided as a correction current to resistor 224 to adjust the voltage across resistor 224, thereby adjusting the bandgap reference output voltage. However, another error source remains, and that error source is the error due to temperature gradients from non-uniform self-heating within circuit 200. The output of thermal error cancellation circuit 230 is coupled to resistor 224 and provides an additional error correction current to compensate for the error in the bandgap reference voltage due to thermal gradients within circuit 200.

Thermal error cancellation circuit 230 can include an array of transistors that sense the temperature, then convert the temperature difference to an error signal. A temperature gradient can be sensed using two temperature sensors. In one embodiment, one of the temperature sensors is located close to the buffer amplifier, and the other temperature sensor is located as far away from the buffer amplifier as is practical. The farther that the two temperature sensors are spaced apart on the integrated circuit, the higher the temperature gradient sense signal will be at a given buffer amplifier power level. While many temperature sensors may be used in thermal error cancellation circuit 230, it is preferable to use a temperature sensor that generates a high-precision, low-noise signal while maintaining a compact circuit.

Figure 3:
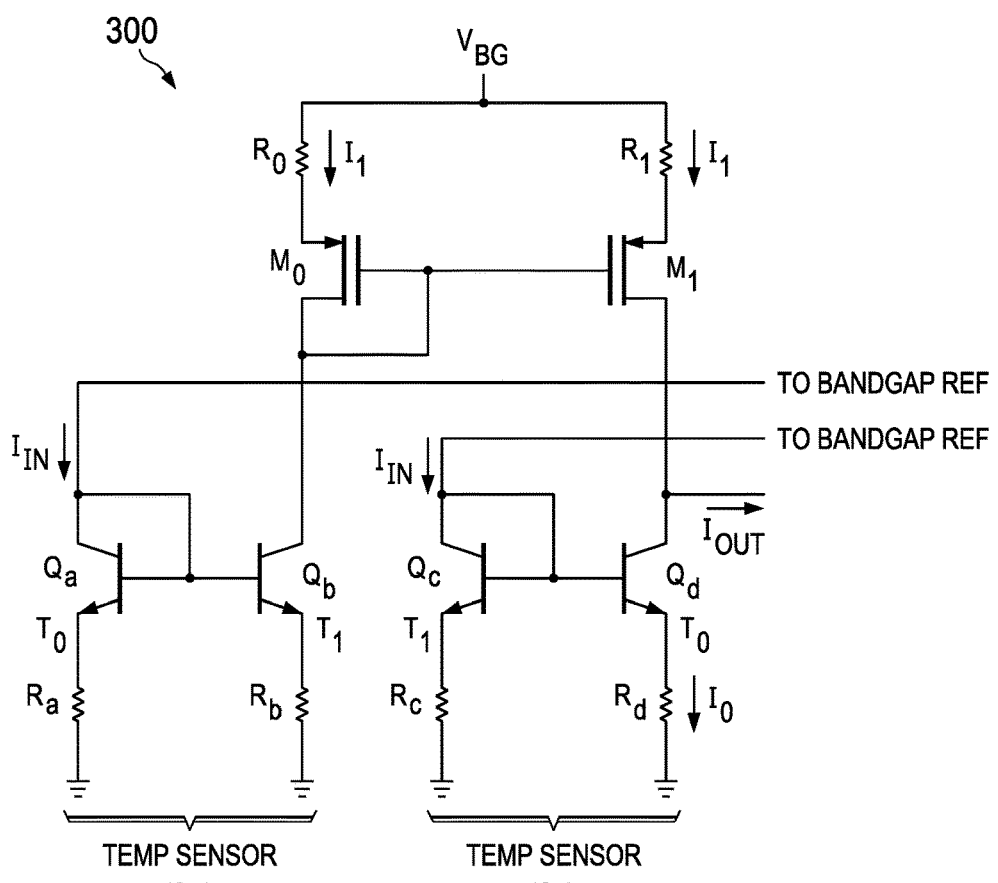
FIG. 3 shows a schematic for an example temperature sensor providing a high-precision, low-noise signal that represents a difference in temperature between two points in a circuit.

FIG. 3 shows a schematic for an example temperature sensor providing a high-precision, low-noise signal that represents a difference in temperature between two points in a circuit. Temperature sensor circuit 300 includes transistors $Q_a$, $Q_b$, $Q_c$, $Q_d$, $M_0$ and $M_1$. Transistors $Q_a$, $Q_b$, $Q_c$ and $Q_d$ are bipolar junction transistors, but the bipolar junction transistors can be replaced with MOSFETs in an alternative embodiment. If the bipolar junction transistors are replaced by MOSFETs, references in this description to bases, emitters and collectors should be replaced with gates, sources and drains, respectively.

The bases of $Q_a$ and $Q_b$ are connected together. The bases of $Q_c$ and $Q_d$ are also connected together. The bases of $Q_a$ and $Q_c$ are connected to the collectors of $Q_a$ and $Q_c$, respectively. Each of transistors $Q_a$, $Q_b$, $Q_c$ and $Q_d$ has a resistor coupled between its emitter and ground. The resistance values are the same for resistors $R_a$ and $R_c$, which are connected to the emitters of $Q_a$ and $Q_c$, respectively. In at least one embodiment, the resistance value is the same for the resistors connected to the emitters of $Q_b$ and $Q_d$, respectively.

The gate of $M_0$ is connected to the gate of $M_1$, the drain of $M_0$ and the collector of $Q_b$. The drain of $M_1$ is connected to the collector of $Q_d$. The source of $M_0$ is connected to the bandgap voltage source, $V_{BG}$, through resistor $R_0$, and the source of $M_1$ is connected to $V_{BG}$ through resistor $R_1$.

If the supply voltage or load current increases, there will be an increase in the buffer amplifier power dissipation, which brings additional heating. The increase in buffer amplifier power, which is directly proportional to the supply voltage and the load current, produces a temperature gradient in the bandgap reference circuit. The base-to-emitter voltage of bipolar junction transistors is dependents upon temperature in a complementary to absolute temperature (CTAT) manner. So, when either the supply voltage or the load current is increased, the base-to-emitter voltage of the individual device increases proportionally. If all the devices increased by the same amount, the two-temperature trim circuit and curvature trim circuits could compensate for and correct the global temperature increase. But because the temperature increase is not uniform throughout the circuit, the difference in temperatures causes a difference in base-to-emitter voltages of the transistors at different locations.

A signal can be provided to two transistors having two different areas, creating a difference in base-to-emitter voltages ($\Delta V_{BE}$). The voltage across $R_a$ is the $\Delta V_{BE}$ between $Q_a$ and $Q_b$. When a current is provided to the collector of $Q_a$, the output current is proportional to the provided current. If the current provided to the collector of $Q_a$ is a proportional to absolute temperature (PTAT) current from a bandgap reference, the output current is also a PTAT current. So, if there is a temperature gradient, the current gain of the transistor is proportional to the gradient, making the transistor useful as a temperature sensor. $Q_a$ is at a first location on the integrated circuit and $Q_b$ is at a second location, so any difference in temperature between the two locations will create a $\Delta V_{BE}$ between $Q_a$ and $Q_b$. As a temperature gradient develops, the temperatures of $Q_a$ and $Q_b$ will not change by the same amount, so the $\Delta V_{BE}$ creates a current through $R_a$ that is proportional to the temperature gradient.

There are two temperature sensors, $S_0$ and $S_1$, that are physically spaced apart on the integrated circuit at opposite ends of the temperature gradient generated by the power dissipation in the buffer amplifier. The location of the corresponding bipolar transistors is reversed between $S_0$ and $S_1$. $Q_a$ in temperature sensor $S_0$ and $Q_d$ in temperature sensor $S_1$ are located proximate one another at a first location on the integrated circuit, and are at temperature $T_0$. $Q_b$ in temperature sensor $S_0$ and $Q_c$ in temperature sensor $S_1$ are located proximate one another at a second location on the integrated circuit, and are at temperature $T_1$.

A current with first and second order components is generated in temperature sensor $S_0$ due to a difference in temperature between $Q_a$ and $Q_b$. A complementary current having the same first and second order components but with opposite polarity will be generated in temperature sensor $S_1$ due to the difference in temperature between $Q_c$ and $Q_d$. The difference between the two currents is proportional to the difference in temperature between $T_0$ and $T_1$. The second order components are cancelled out when the currents are added together, providing an output that is linearly proportional to the temperature gradient.

Figure 4:
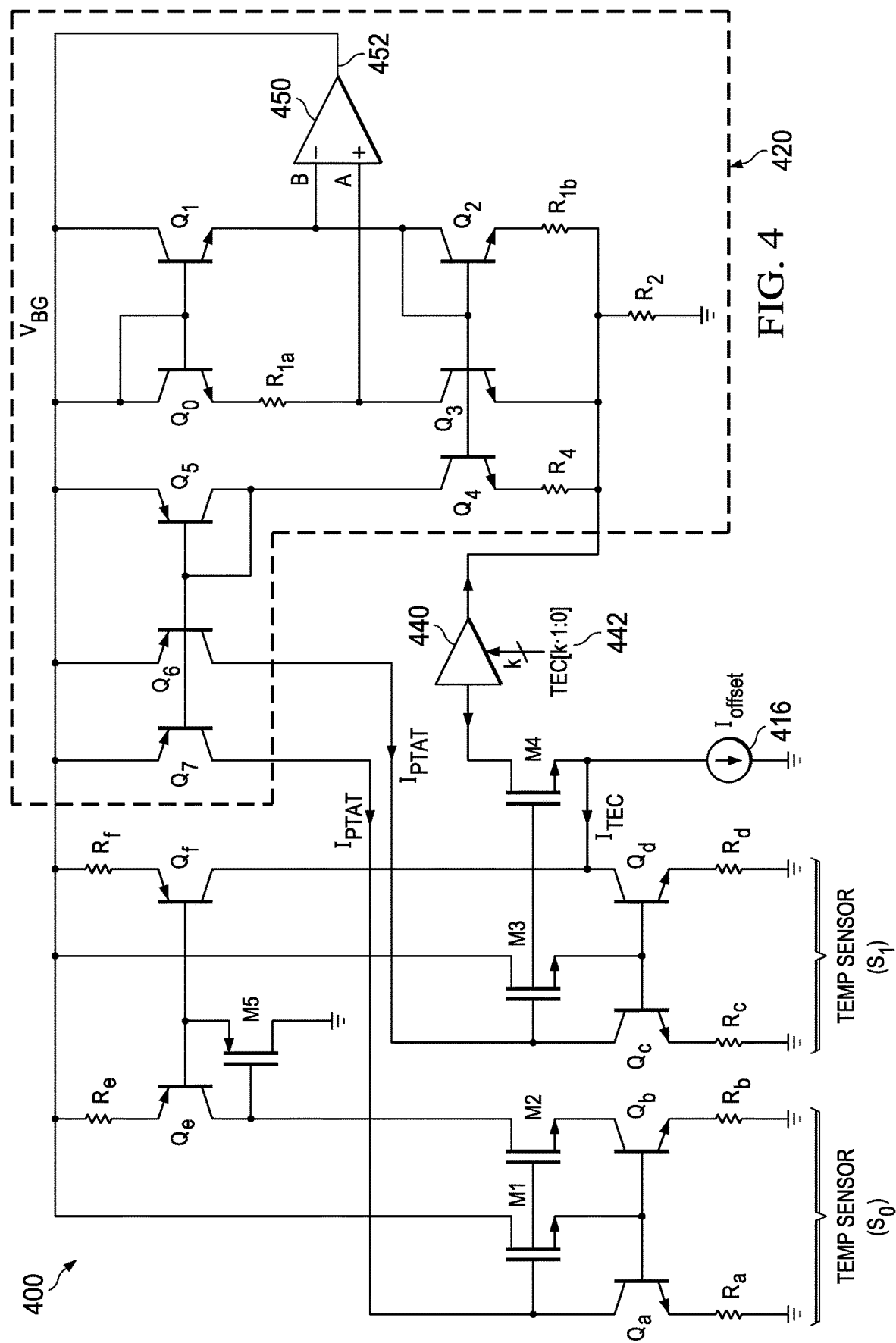
FIG. 4 shows a schematic for an example bandgap reference circuit with temperature sensors at two locations in the circuit and having thermal error compensation.

Line regulation error can also be reduced by generating a signal that is proportional to the temperature gradient. Minimizing the line regulation error requires that the line regulation error be properly scaled to remove any temperature gradient error. FIG. 4 shows a schematic for an example bandgap reference circuit 400 with temperature sensors at two locations in the circuit and having thermal error compensation.

The temperature sensor circuit includes transistors $Q_a$, $Q_b$, $Q_c$, $Q_d$, $Q_e$, $M_0$, $M_1$, $M_2$, $M_3$, $M_4$, and $M_5$. Transistors $Q_a$, $Q_b$, $Q_c$, $Q_d$ and $Q_e$ are bipolar junction transistors, but the bipolar junction transistors can be replaced with MOSFETs in an alternative embodiment. If the bipolar junction transistors are replaced by MOSFETs, references in this description to bases, emitters and collectors should be replaced with gates, sources and drains, respectively.

The bases of $Q_a$ and $Q_b$ are connected together and are connected to the source of $M_1$. The bases of $Q_c$ and $Q_d$ are connected together. The bases of $Q_e$ and $Q_f$ are connected together and are connected to the source of $M_5$. The gates of $M_1$ and $M_2$ are connected together, and are connected to the collector of $Q_a$. The gates of $M_3$ and $M_4$ are connected together, and are connected to the collector of $Q_c$. Transistors $Q_a$, $Q_b$, $Q_c$ and $Q_d$ have resistors $R_a$, $R_b$, $R_c$ and $R_d$, respectively, coupled between their emitters and ground. Transistors $Q_e$ and $Q_f$ have resistors $R_e$ and $R_f$, respectively, coupled between their emitters and a bandgap reference voltage output.

The source of $M_5$ is connected to the bases of $Q_e$ and $Q_f$. The gate of $M_5$ is connected to the collector of $Q_e$, and the drain of $M_5$ is connected to ground. The drains of $M_1$ and $M_3$ are connected to the bandgap reference voltage output 452. The drain of $M_2$ is connected to the collector of $Q_c$. The source of $M_4$ is connected to the collector of $Q_d$. The collectors of $Q_a$ and $Q_c$ receive a current $I_{PTAT}$ from bandgap reference circuit 420.

Bandgap reference circuit 420 includes transistors $Q_0$, $Q_1$, $Q_2$, $Q_3$, $Q_4$, $Q_5$, $Q_6$, $Q_7$ and buffer amplifier 450. The emitters of $Q_0$, $Q_1$, $Q_5$, $Q_6$ and $Q_7$ are connected to the bandgap reference voltage output 452. The collector of $Q_7$ is connected to the collector of $Q_a$. The collector of $Q_6$ is connected to the collector of $Q_c$. The bases of $Q_5$, $Q_6$ and $Q_7$ are connected together. The base of $Q_2$ is connected to the bases of $Q_3$ and $Q_4$ and to the collector of $Q_2$. The base of $Q_0$, is connected to the base of $Q_1$ and to the collector of $Q_0$. The emitter of $Q_3$ is connected to the emitter of $Q_4$ through resistor $R_4$, and connected to the emitter of $Q_2$ through resistor $R_{1b}$.

Buffer amplifier 450 has a first input connected to the emitter of $Q_1$ and to the emitter and base of $Q_2$. Buffer amplifier 450 has a second input connected to the collector of $Q_3$ and to the emitter and to the emitter of $Q_0$ through resistor $R_{1a}$. Buffer amplifier 450 has an output that is the bandgap reference voltage output 452.

There are two temperature sensors, $S_0$ and $S_1$, physically spaced apart at opposite ends of the integrated circuit to sense the temperature gradient generated by the power dissipation in buffer amplifier 450. The location of the corresponding bipolar transistors is reversed between $S_0$ and $S_1$. $Q_a$ from temperature sensor $S_0$ and $Q_d$ from temperature sensor $S_1$ are located proximate one another at a first location on the integrated circuit, preferably near buffer amplifier 450, and are at temperature $T_0$. $Q_b$ in temperature sensor $S_0$ and $Q_c$ in temperature sensor $S_1$ are located proximate one another at a second location on the integrated circuit, preferably distant from buffer amplifier 450, and are at temperature $T_1$.

A current having first and second order components is generated in temperature sensor $S_0$ due to a difference in temperature between $Q_a$ and $Q_b$. A complementary current with opposite polarity will be generated in temperature sensor $S_1$ due to the difference in temperature between $Q_c$ and $Q_d$ having the same first and second order components as the current in $S_0$. The difference between the two currents is proportional to the difference in temperature between $T_0$ and $T_1$. The second order components are cancelled out when the currents are added together, thereby producing an output at the collector of $M_4$ that is linearly proportional to the temperature gradient.

The emitter of $M_4$ is coupled to offset current source 416. Offset current source 416 provides a trim current that can be adjusted using a two-temperature test to reduce the error due to uniform ambient temperature changes on integrated circuit 400. The collector of $M_4$ is coupled to the input of amplifier 440. Amplifier 440 is a digitally programmable current amplifier having an input coupled to the drain of $M_4$. The source of $M_4$ is coupled to offset current source 416. The gain of amplifier 440 can be adjusted to scale the output signal appropriately. In one embodiment, amplifier 440 can be implemented as a series of current mirrors, each current mirror being coupled to multiple taps on a resistor ladder. The output of amplifier 440 is the thermal error compensation current.

In an alternative embodiment, amplifier 440 may include a digital-to-analog converter that receives the thermal error compensation signal as a digital command and generates a current signal in response. The output of amplifier 440 is coupled to ground through resistor $R_2$. The output of amplifier 440 is also coupled to the emitter of $Q_3$, and to the emitters of $Q_2$ and $Q_4$ through resistors $R_4$ and $R_{1b}$, respectively.

The thermal error cancellation signal has a PTAT current component, which is the two-temperature trim offset current. A two-temperature trim for offset and a temperature coefficient slope correction may be performed in addition to the thermal error cancellation trim for a precision voltage reference. If the thermal error cancellation trim is performed before the two-temperature trim, the additional PTAT output voltage component can be corrected out during the two-temperature trim.

When a trim is performed on the output voltage of a device, a trim code that provides the most accurate output voltage can be chosen. Here, however, the trim is not being performed to obtain a particular output voltage. Rather, the trim is performed to remove the error due to temperature gradient. So, the trim method must take this difference into account.

Figure 5:
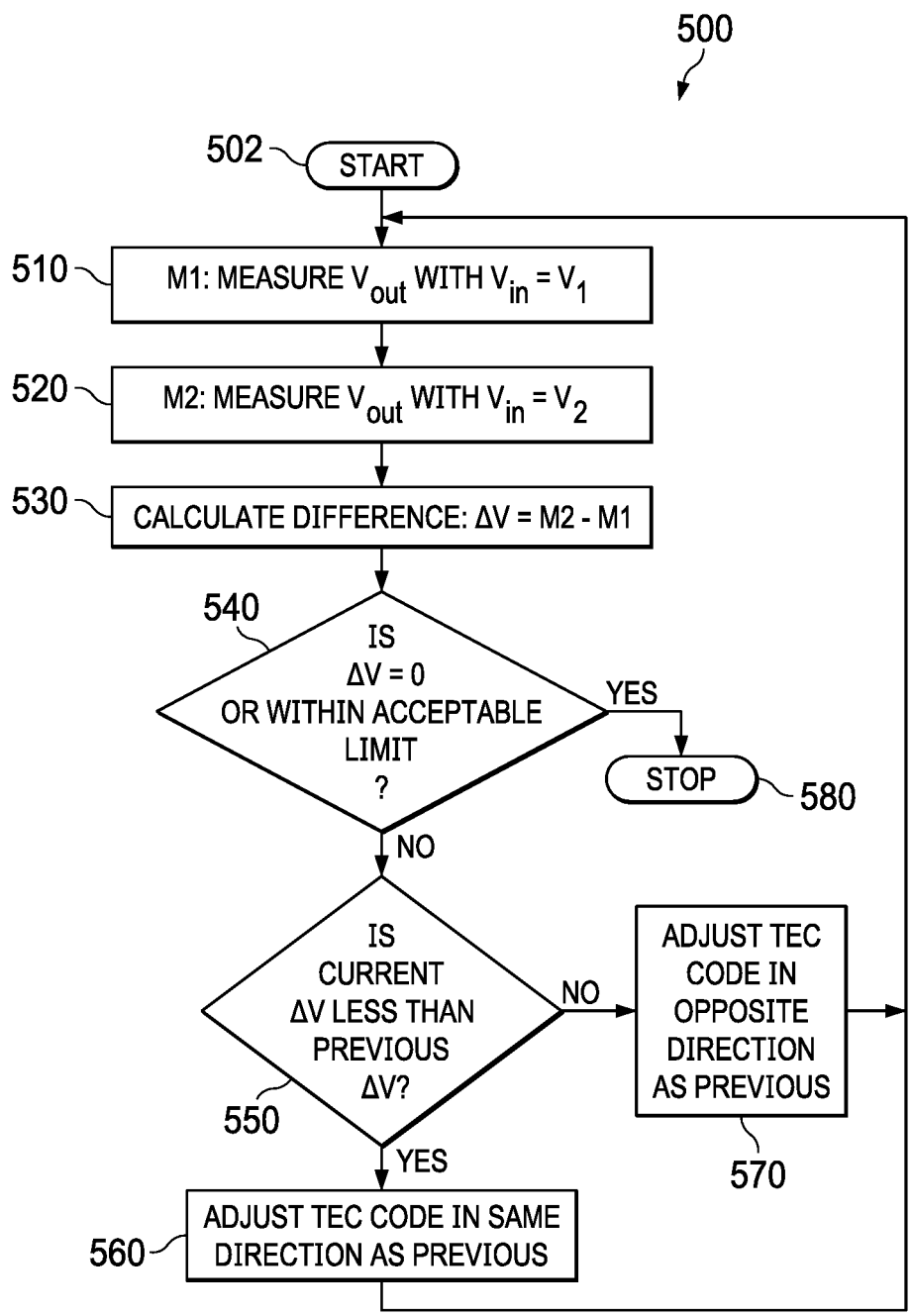
FIG. 5 shows a flow chart for a method of determining a thermal error cancellation code.

FIG. 5 shows a flow chart for a method of determining a thermal error cancellation (TEC) code. In step 510, the input voltage is set to $V_1$, and the output voltage $V_{out}$ is measured (M1). In step 520, the input voltage is set to $V_2$, and the output voltage $V_{out}$ is measured (M2). In step 530, M2 is subtracted from M1, and the difference ($\Delta V$) between the two measurements is the error caused by thermal gradients. In step 540, if $\Delta V$ is within an acceptable tolerance of zero, the TEC code adjustment is complete, and the process goes to step 580 and ends. If $\Delta V$ is not within the acceptable tolerance of zero, the process continues to step 550.

In step 550, the direction of the next adjustment to the TEC code is determined in response to $\Delta V$. If the current $\Delta V$ decreased from the previous $\Delta V$, an adjustment is made to the TEC code in the same direction as the previous adjustment, step 560. If the current ΔV increased from the previous ΔV, an adjustment is made to the TEC code in the opposite direction from the previous adjustment, step 570. Following either step 560 or step 570, steps 510, 520 and 530 are then repeated. This process continues until ΔV is within an acceptable tolerance of zero in step 540, at which time the process goes to step 580 and ends.

As used herein, "terminal", "node", "interconnection", "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground, and/or any other form of ground connection applicable to, or suitable for, the teachings of this description.

In this description, even if operations are described in a particular order, some operations may be optional, and the operations are not necessarily required to be performed in that particular order to achieve desirable results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. An integrated circuit for temperature gradient compensation of a bandgap voltage, the integrated circuit comprising:
    a bandgap core circuit having a bandgap feedback input, a bandgap adjustment input and a bandgap reference output;
    a compensation resistor coupled between the bandgap adjustment input and a ground terminal;
    an offset and slope correction circuit having an offset correction output coupled to the bandgap adjustment input;
    a thermal error cancellation (TEC) circuit having a TEC output coupled to the bandgap adjustment input, the TEC circuit including first and second temperature sensors spaced from each other, the TEC circuit configured to provide a signal at the TEC output responsive to temperatures at the first and second temperature sensors; and
    an amplifier having an amplifier input and an amplifier output, the amplifier input coupled to the bandgap reference output.

2. The integrated circuit of claim 1, further comprising a curvature correction circuit having a curvature correction output coupled to the bandgap adjustment input.

3. The integrated circuit of claim 1, wherein:
    the first temperature sensor includes:
        a first transistor at a first location, the first transistor having first and second current terminals and a first control terminal, the first current terminal is coupled to the first control terminal, the second current terminal is coupled to the ground terminal through a first resistor, and the first current terminal provides a first temperature signal responsive to a temperature at the first location;
        a second transistor at a second location, the second transistor having third and fourth current terminals and a second control terminal, the second control terminal is coupled to the first control terminal, and the fourth current terminal is coupled to the ground terminal through a second resistor; and
    the second temperature sensor includes:
        a third transistor at the second location, the third transistor having fifth and sixth current terminals and a third control terminal, the third control terminal is coupled to the fifth current terminal, the sixth current terminal is coupled to the ground terminal through a third resistor, and the fifth current terminal provides a second temperature signal responsive to a temperature at the second location; and
        a fourth transistor at the first location, the fourth transistor having seventh and eighth current terminals and a fourth control terminal, the fourth control terminal is coupled to the third control terminal, and the fourth current terminal is coupled to the ground terminal through a fourth resistor.

4. The integrated circuit of claim 3, further comprising:
    a fifth transistor having ninth and tenth current terminals and a fifth control terminal, the ninth current terminal coupled to a reference voltage terminal, and the tenth current terminal coupled to the fifth control terminal and to the third current terminal; and
    a sixth transistor having eleventh and twelfth current terminals and a sixth control terminal, the eleventh current terminal coupled to a reference voltage terminal, and the twelfth current terminal coupled to the seventh current terminal.

5. The integrated circuit of claim 4, wherein the first, second, third and fourth transistors are bipolar junction transistors, and the fifth and sixth transistors are FETs.

6. The integrated circuit of claim 1, wherein the bandgap core circuit is configured to provide a voltage at the bandgap reference output proportional to the voltage across the compensation resistor.

7. An integrated circuit for temperature gradient compensation of a bandgap voltage, the integrated circuit comprising:
    a bandgap reference circuit having a bandgap adjustment input and a bandgap reference output;
    a first transistor at a first location and having first and second current terminals and a first control terminal, and the second current terminal is coupled to a ground terminal through a first resistor;
    a second transistor at a second location and having third and fourth current terminals and a second control terminal, the second control terminal is coupled to the first control terminal, and the fourth current terminal is coupled to the ground terminal through a second resistor;
    a third transistor at the second location and having fifth and sixth current terminals and a third control terminal, the sixth current terminal is coupled to the ground terminal through a third resistor;
    a fourth transistor at the first location and having seventh and eighth current terminals and a fourth control terminal, the fourth control terminal is coupled to the third control terminal, and the fourth current terminal is coupled to the ground terminal through a fourth resistor;
    a fifth transistor coupled between the bandgap reference output and the first control terminal, and having a fifth control terminal coupled to the first current terminal;
    a sixth transistor having ninth and tenth current terminals and a sixth control terminal, the sixth control terminal is coupled to the fifth control terminal, and the tenth current terminal is coupled to the third current terminal;

a seventh transistor coupled between the bandgap reference output and the third control terminal, and having a seventh control terminal coupled to the fifth current terminal;

an eighth transistor having eleventh and twelfth current terminals and an eighth control terminal, the eighth control terminal is coupled to the seventh control terminal, and the twelfth current terminal is coupled to the seventh current terminal; and an amplifier having an amplifier input and an amplifier output, the amplifier input coupled to the eleventh current terminal, and the amplifier output configured to provide a signal proportional to a temperature difference between the first location and the second location.

8. The integrated circuit of claim 7, further comprising an offset correction current source coupled between the seventh current terminal and the ground terminal.

9. The integrated circuit of claim 7, wherein the amplifier is a programmable gain amplifier.

10. The integrated circuit of claim 9, wherein the programmable gain amplifier includes current mirrors, and each current mirror is coupled to taps on a resistor ladder.

11. The integrated circuit of claim 7, wherein the first, second, third and fourth transistors are bipolar junction transistors, and the fifth, sixth, seventh and eighth transistors are FETs.

12. The integrated circuit of claim 7, wherein a compensation resistor is coupled between the bandgap adjustment input and the ground terminal, and a voltage at the bandgap reference output is adjusted by changing a current through the compensation resistor.

13. The integrated circuit of claim 7, wherein the bandgap reference circuit includes a ninth transistor coupled between the bandgap reference output and the first current terminal.

14. The integrated circuit of claim 13, wherein the bandgap reference circuit also includes a tenth transistor coupled between the bandgap reference output and the fifth current terminal.

* * * * *